United States Patent
Hofer et al.

(10) Patent No.: US 9,465,055 B2
(45) Date of Patent: Oct. 11, 2016

(54) ELECTRONIC CIRCUIT AND METHOD FOR MEASURING A LOAD CURRENT

(71) Applicant: Infineon Technologies AG, Neubiberg (DE)

(72) Inventors: Maximilian Hofer, Hartberg (AT); Christoph Boehm, Graz (AT)

(73) Assignee: INFINEON TECHNOLOGIES AG, Neubiberg (DE)

(*) Notice: Subject to any disclaimer, the term of this patent is extended or adjusted under 35 U.S.C. 154(b) by 131 days.

(21) Appl. No.: 14/037,491

(22) Filed: Sep. 26, 2013

(65) Prior Publication Data

US 2015/0084618 A1   Mar. 26, 2015

(51) Int. Cl.
*G01R 19/00* (2006.01)

(52) U.S. Cl.
CPC .................. *G01R 19/0038* (2013.01)

(58) Field of Classification Search
CPC .............. G01R 19/00; G01R 19/0038; G01R 19/16566; G01R 19/16571; G01R 19/257; G01R 17/12; G01R 31/40

USPC ................ 324/606, 647, 656, 665, 672, 679
See application file for complete search history.

(56) References Cited

U.S. PATENT DOCUMENTS

| | | |
|---|---|---|
| RE37,778 E | 7/2002 | Feldtkeller |
| 7,129,683 B2 | 10/2006 | Haider et al. |
| 7,183,755 B2 | 2/2007 | Itoh et al. |
| 2012/0262137 A1 | 10/2012 | Arigliano et al. |

*Primary Examiner* — Son Le

(57) ABSTRACT

An electronic circuit is described comprising a load, a power supply node, a first transistor coupled between the supply node and the load such that the input at a control terminal of the first transistor controls current flow from the supply node to the load through the first transistor, a current source, a second transistor coupled between the current source and the load such that the input at a control terminal of the second transistor controls current flow from the current source to the load through the second transistor, a control node coupled to the control terminal of the first transistor and the control terminal of the second transistor and a measuring circuit connected to the point of coupling between the current source and the second transistor configured to measure the difference between the current provided by the current source and the current consumed by the second transistor.

17 Claims, 8 Drawing Sheets

ELECTRONIC CIRCUIT AND METHOD FOR MEASURING A LOAD CURRENT

TECHNICAL FIELD

The present disclosure relates to electronic circuits and methods for measuring a load current.

BACKGROUND

In an electronic circuit where a load is supplied by means of a voltage regulator such as a low-dropout (LDO) regulator, as for example in an NMOS path device, it may be required to measure the current consumed by the load. Efficient approaches to measure this current are desirable.

SUMMARY

An electronic circuit is provided including a load, a power supply node, a first transistor coupled between the supply node and the load such that the input at a control terminal of the first transistor controls the current flow from the supply node to the load through the first transistor, a current source, a second transistor coupled between the current source and the load such that the input at a control terminal of the second transistor controls the current flow from the current source to the load through the second transistor, a control node coupled to the control terminal of the first transistor and the control terminal of the second transistor and a measuring circuit connected to the point of coupling between the current source and the second transistor configured to measure the difference between the current provided by the current source and the current consumed by the second transistor.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
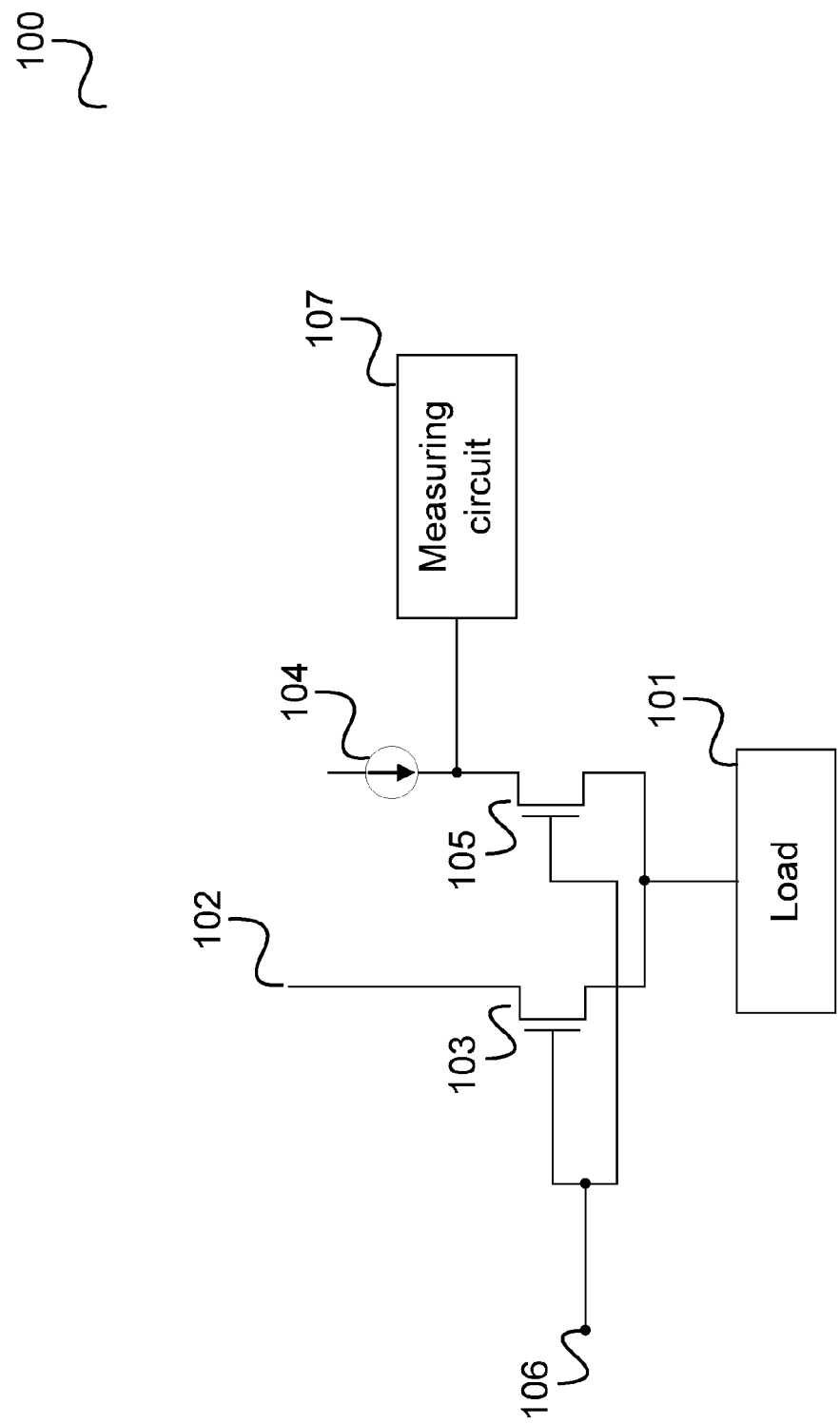
FIG. 1 shows an electronic circuit.

FIG. 1 shows an electronic circuit 100 according to an embodiment.

The electronic circuit 100 includes a load 101, a power supply node 102 and a first transistor 103 coupled between the supply node 102 and the load 101 such that the input at a control terminal of the first transistor 103 controls current flow from the supply node 102 to the load 101 through the first transistor 103.

Further, the electronic circuit 100 includes a current source 104 and a second transistor 105 coupled between the current source 104 and the load 101 such that the input at a control terminal of the second transistor 105 controls current flow from the current source 104 to the load 101 through the second transistor 105.

The electronic circuit 100 further includes a control node 106 coupled to the control terminal of the first transistor and the control terminal of the second transistor and a measuring circuit 107 connected to the point of coupling between the current source and the second transistor configured to measure the difference between the current provided by the current source 104 and the current consumed by the second transistor 105.

In other words, according to one embodiment, a measuring circuit performs a delta (i.e. difference) measurement of the current provided by a current source and the current forwarded to a load by a transistor. From this difference, the current consumed by the load (i.e. the current provided to the load by means of the first transistor and the second transistor) may be determined by taking into account the width ratio between the first transistor and the second transistor.

According to one embodiment, the measuring circuit is connected to the point of coupling between the current source and the second transistor such that it receives the current provided by the current source and not consumed by the second transistor.

The measuring circuit is for example configured to measure the size of the received current to measure the difference between the current provided by the current source and the current consumed by the second transistor.

According to one embodiment, the electronic circuit further includes a determiner configured to determine the current consumed by the load based on the difference between the current provided by the current source and the current consumed by the second transistor.

The determiner is for example configured to determine the current consumed by the load based on the width ratio of the first transistor and the second transistor.

According to one embodiment, the measuring circuit is configured to output a signal indicating the difference between the current provided by the current source and the current consumed by the second transistor.

The measuring circuit is for example a comparator configured to compare the difference with a reference current and output a signal indicating whether the difference is higher than the reference current.

The first transistor has for example a higher width than the second transistor.

According to one embodiment, the transistors are field-effect transistors, for example n-channel field effect transistors such as NMOS transistors.

The control terminal of the first transistor may be the gate terminal of the first transistor and the control terminal of the second transistor may be the gate terminal of the second transistor.

The first transistor is for example coupled between the supply node and the load with its source terminal and its drain terminal.

The second transistor is for example coupled between the current source and the load with its source terminal and its drain terminal.

According to one embodiment, the electronic circuit further includes a voltage regulator configured to provide a control signal to the control node.

The measuring circuit is for example an amperemeter.

Figure 2:
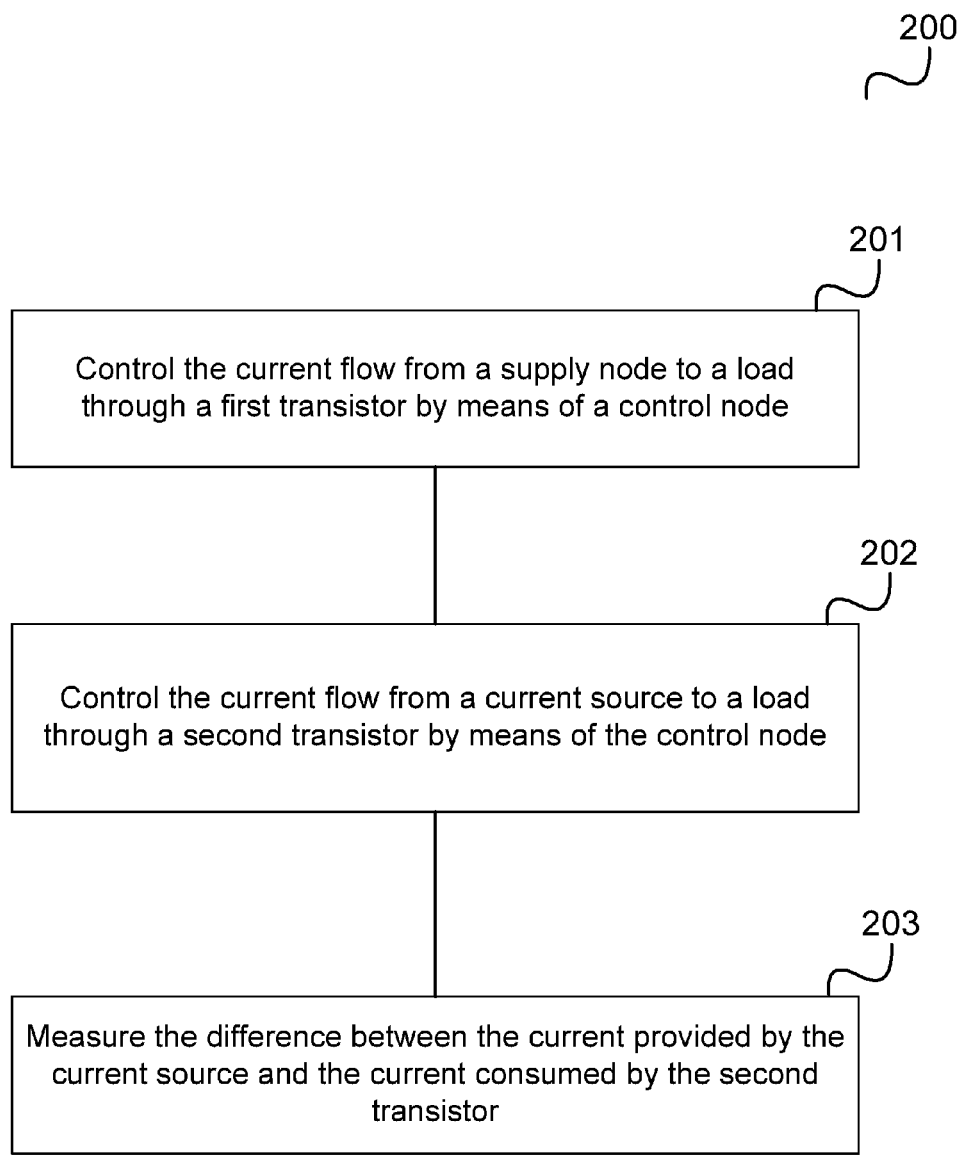
FIG. 2 shows a flow diagram illustrating a method for measuring a load current.

The electronic circuit 100 for example carries out a method as illustrated in FIG. 2.

FIG. 2 shows a flow diagram 200.

The flow diagram 200 illustrates a method for measuring a load current.

The method includes controlling the current flow from a supply node to a load through a first transistor by means of a control node in 201 and (e.g. at the same time) controlling the current flow from a current source to a load through a second transistor by means of the control node 202.

The method further includes measuring the difference between the current provided by the current source and the current consumed by the second transistor in 203, e.g. in parallel to controlling the current flows to the load through the first transistor and the second transistor.

The method may further include determining the current consumed by the load based on the difference between the current provided by the current source and the current consumed by the second transistor.

According to one embodiment, the method includes controlling current flow from a supply node to a load through a first transistor and controlling the current flow from a current source to a load through a second transistor by means of applying a control signal via the control node to a control terminal of the first transistor and a control terminal of the second transistor.

It should be noted that embodiments described in context of the electronic circuit 100 are analogously valid for the method illustrated in FIG. 2 and vice versa. Further, the various embodiments may be combined with each other.

In the following, an example for an electronic circuit as described above with reference with FIG. 2 is described in more detail.

Figure 3:
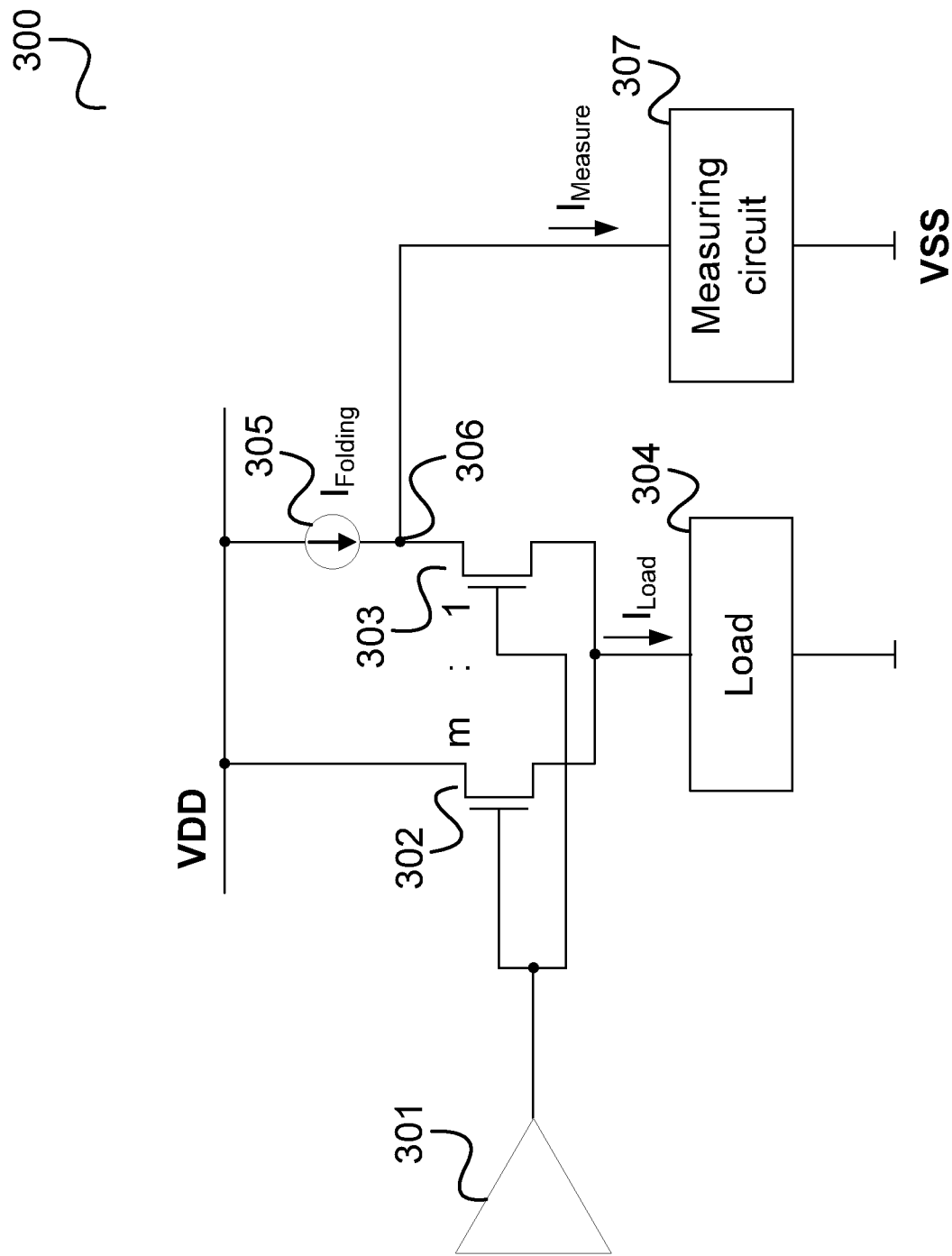
FIG. 3 shows an electronic circuit.

FIG. 3 shows an electronic circuit 300.

The electronic circuit 300 includes a regulator 301, e.g. a low dropout (LDO) regulator which provides a control signal to the gate of a first NMOS transistor 302 (n channel metal oxide semiconductor) transistor and a second NMOS transistor 303. The source terminals of the transistors 302, 303 are connected to a load 304 via a first supply terminal of the load 304. A second supply terminal of the load 304 is connected to a low supply potential (VSS). The drain of the first transistor 302 is connected to a high supply potential (VDD). A current source 305 is connected between the high supply potential 305 and the drain of the second transistor 303.

The transistors 302, 303 and the current source 305 can be seen to form an NMOS path device.

At a point of coupling 306 between the current source 305 and the second transistor 303, the input of a measuring circuit 307 is connected. The measuring circuit 307 is further connected to the low supply potential.

The first transistor 302 and the second transistor 303 have a ratio of m:1 such that the current through the first transistor is m times higher than the current through the second transistor since they receive the same control voltage at their gate terminals.

Since the sum of the current through the first transistor and the current through the second transistor forms the current supplied to the load $I_{Load}$, the current $I_{Measure}$ supplied to the measuring circuit 307 is given by $$I_{Measure} = -\frac{I_{Load}}{m+1} = I_{Folding}.$$

The current supplied by the current source 305 $I_{Folding}$ is chosen to be higher than the maximum current consumed by the second transistor 303 (i.e. the maximum current that is supplied by the second transistor 303 to the load 304). The measuring circuit measures the part of the current supplied by the current source 305 which is not consumed (i.e. forwarded to the load 304) by the second transistor 303.

The current consumed by the second transistor 303 and the measured current supplied to the measuring circuit 307 can be seen to be folded at the point of coupling 306.

Figure 4:
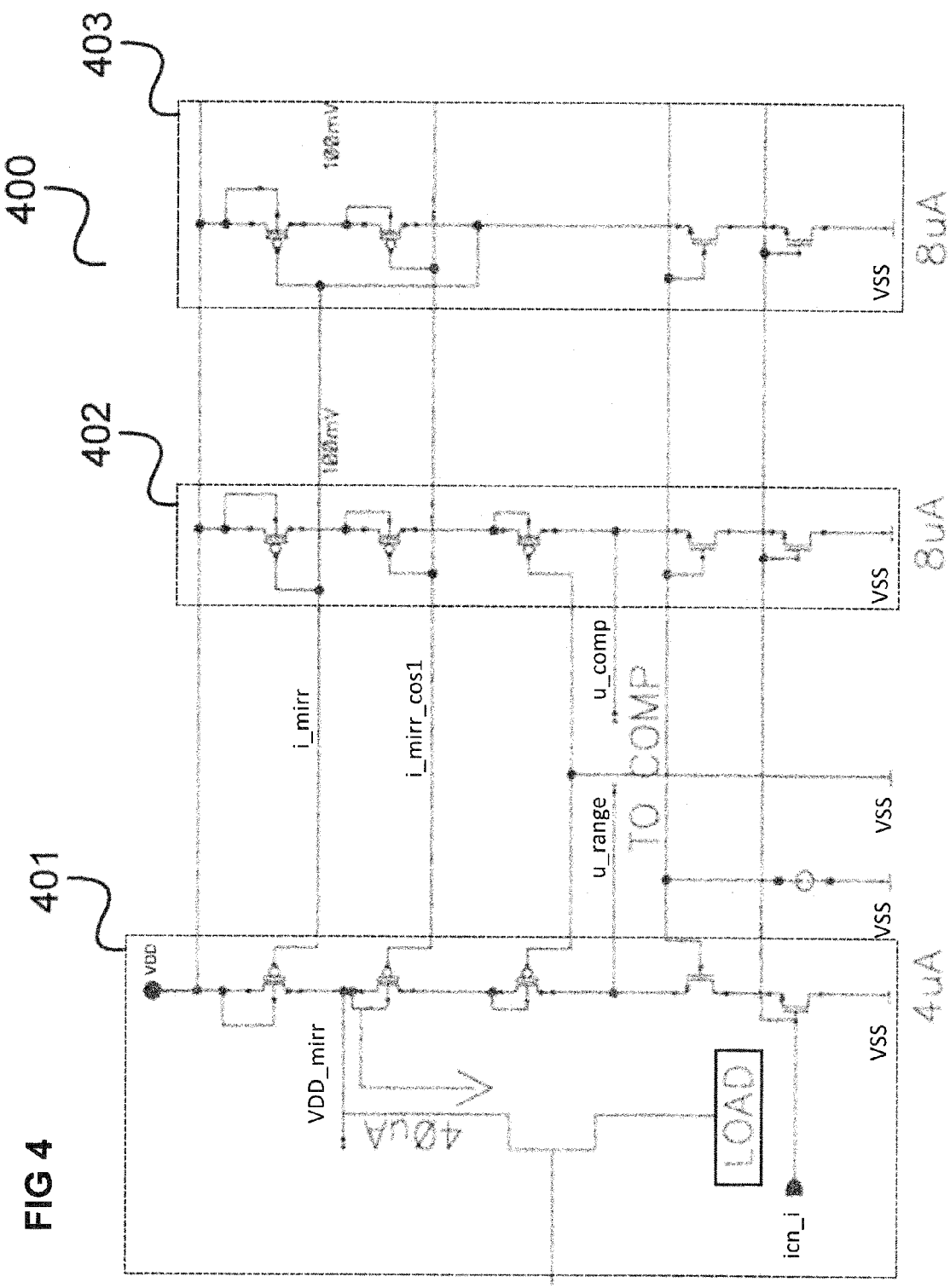
FIG. 4 shows an example for an implementation of the electronic circuit of FIG. 3.

An example for an implementation of the branch formed by the current source 305 and the second transistor 303 and the measuring circuit is shown in FIG. 4.

FIG. 4 shows an electronic circuit 400.

The electronic circuit 400 includes a first part 401 corresponding to the current source 305, the second transistor 303 and (at least a part of) the measuring circuit 307.

A second part 402 of the electronic circuit 400 is configured to provide a reference voltage (referred to as u_comp) which can be used by a comparator or levelshifter for generating a differential signal to get a digitally well defined output signal indicating the measurement result.

A third part 403 of the electronic circuit 400 provides various control voltages to the first part such as a cascode voltage.

Figure 5:
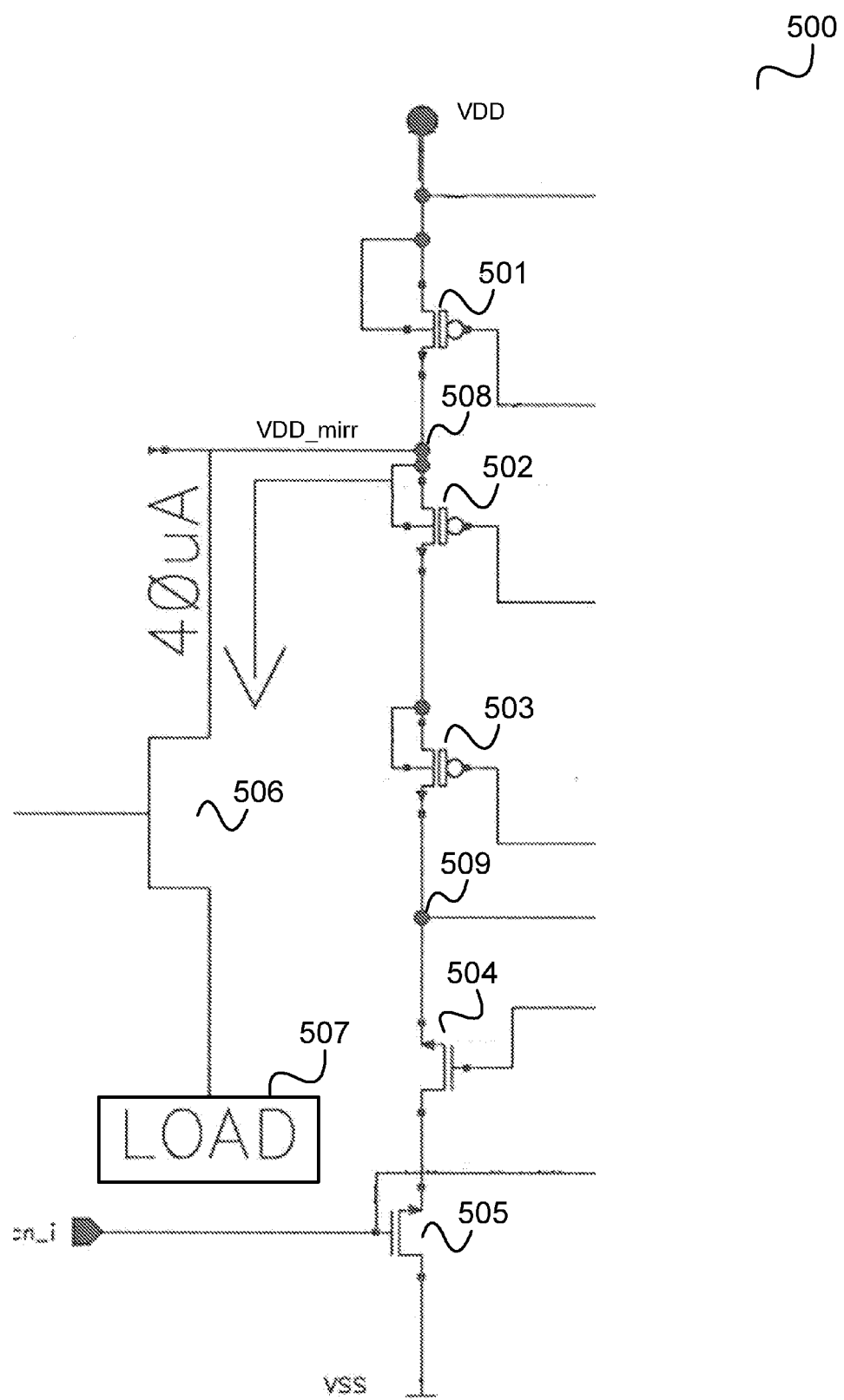
FIG. 5 shows a part of the electronic circuit of FIG. 4 in higher detail.

The first part 401 of the electronic circuit 400 is shown in more detail in FIG. 5.

FIG. 5 shows an electronic circuit 500.

The electronic circuit 500 includes a first PMOS (p channel MOS) transistor 501, a second PMOS transistor 502, a third PMOS transistor 503, a first NMOS transistor 504, a second NMOS transistor 505 and a third NMOS transistor 506.

The third NMOS transistor 506 corresponds to the second transistor 303. Accordingly, its source terminal is connected to a load 507 and its drain terminal is connected to a point of coupling 508.

The source of the first PMOS transistor 501 is connected to the high supply potential (VDD). The drain of the first PMOS transistor 501 is connected to the point of coupling 508. The source of the second PMOS transistor 502 is connected to the point of coupling 508. The drain of the second PMOS transistor 502 is connected to the source of the third PMOS transistor 503. The drain of the third PMOS transistor 503 is connected to the drain of the first NMOS transistor 504. The source of the first NMOS transistor 504 is connected to the drain of the second NMOS transistor 505. The source of the second NMOS transistor 505 is connected to the low supply potential (VSS).

The electronic circuit 400 is for example implemented in 65 nm. The supply voltage VDD ranges for example between 1.62V and 5.5V. For this, a very high PSRR (Power Supply Rejection Ratio) is needed.

The first PMOS transistor 501 implements a PMOS current source of 44 uA. It should be noted that to provide a greater range of currents, the number of transistors may be changed (e.g. the first PMOS transistor 501 may be replaced by a plurality of transistors).

The second PMOS transistor 502 implements a PMOS Cascode to have a constant voltage on the node to the path device, i.e. the point of coupling 508.

The third PMOS transistor 503 implements a PMOS Cascode to protect the NMOS transistors 504, 505 (which are low voltage devices) from mid voltage.

The first NMOS transistor 504 implements an NMOS Cascode.

The second NMOS transistor 505 implements an NMOS current sink of 4 uA (according to a control signal icn provided at its gate terminal).

The gate terminals of the PMOS transistors 501, 502, 503 and the first NMOS transistor 504 are connected to the second part 402 and 403.

In the implementation illustrated in FIGS. 4 and 5 the voltage u_range at a node 509 where the drain of the third PMOS transistor 503 is connected to the drain of the first NMOS transistor 504 is compared with the reference voltage u_comp provided by the second circuit part 402.

By this comparison, it is measured whether the current through the second PMOS transistor 502 and the third PMOS transistor 503 is 4 uA or higher or whether it is lower than 4 uA. Since the current source in form of the first PMOS transistor 501 provides a current of 44 uA it is thus determined whether the current through the third NMOS transistor is 40 uA or higher or whether it is lower than 40 uA.

For example, the ratio m:1 is 99:1. Thus, 1% of the current through the load 507 is used for the measurement and by determining whether the current through the third NMOS transistor is 40 uA or higher whether it is lower than 40 uA it is detected whether the load consumption is 4 mA or more or whether it is lower than 4 mA.

The second PMOS transistor 502, the third PMOS transistor 503, the comparator (not shown), the first NMOS transistor 504 and the second NMOS transistor 505 can in this embodiment be seen as the measuring circuit 307. The second PMOS transistor 502, the third PMOS transistor 503, the comparator (not shown), the first NMOS transistor 504 and the second NMOS transistor 505 can be seen as a measurement branch.

In this embodiment, the measurement of the current can be seen as a 1 bit measurement indicating whether the current through the load is below 40 mA or whether it is equal or higher than 40 mA.

In one embodiment, the current may also be measured with an ADC with higher granularity (i.e. with an output of more than one bit as in case of the comparator in the embodiment described above). For this, a resistor may be used instead of the cascaded current sink (implemented by the first NMOS transistor 504 and the second NMOS transistor 505).

The current consumed by the current sink may be calibrated and the whole electronic circuit may be adjusted in various ways.

In one embodiment, the current flowing through the measurement branch may be averaged. For this, the cascaded current transistor, i.e. the second NMOS transistor 505 together with the first NMOS transistor 504 may be replaced with an RC combination such as illustrated in FIG. 6.

Figure 6:
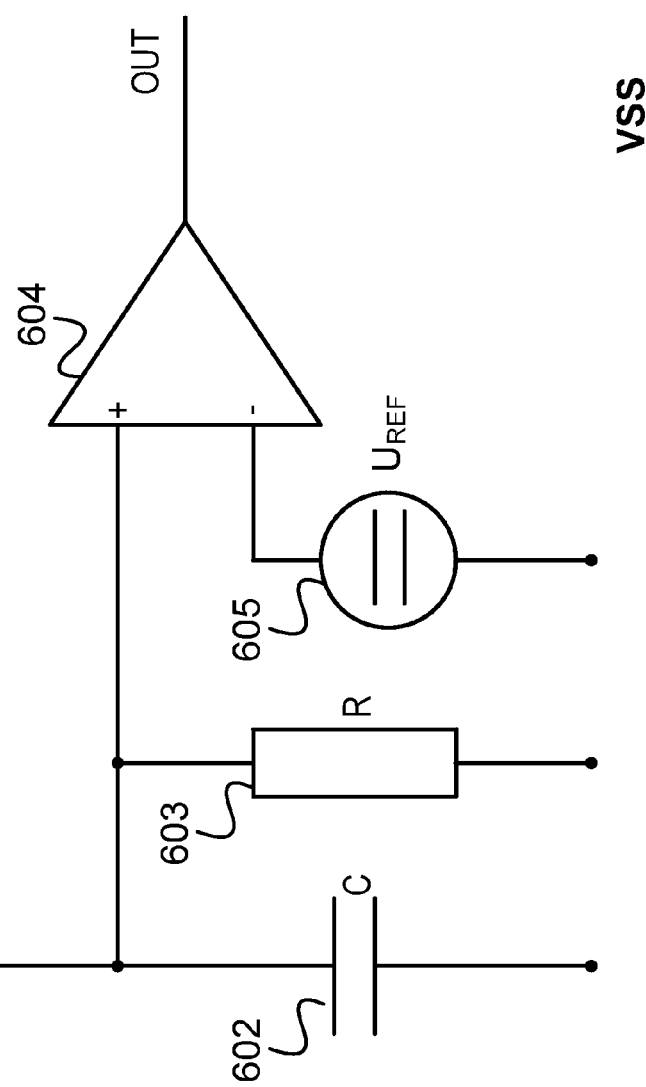
FIG. 6 shows a comparator circuit.

FIG. 6 shows a comparator circuit 600.

The comparator circuit 600 includes an input node 601 which is for example coupled to the drain of the third PMOS transistor 503. A capacitor 602 and a resistor 603 are connected in parallel between the input node 601 and the lower supply potential (VSS).

The comparator circuit 600 further includes a differential amplifier 604 whose positive input is coupled to the input node 601. A voltage source providing a reference voltage is connected between the negative input of the differential amplifier and the lower supply potential.

The resistor 603 is selected to have the size:

$$R = \frac{U_{REF}}{I_{IN}}.$$

Here, $I_{IN}$ is the threshold current to be detected, i.e. the output of the differential amplifier 604 indicates whether the current received via the input node 601 is above $I_{IN}$ or below. With the values of the example above, $I_{IN}$ is for example 4 uA.

The capacity of the capacitor 603 is calculated based on the desired dynamic behavior. A smaller capacity allows a faster measurement while a larger capacity allows filtering out current spikes in the measurement.

Figure 7:
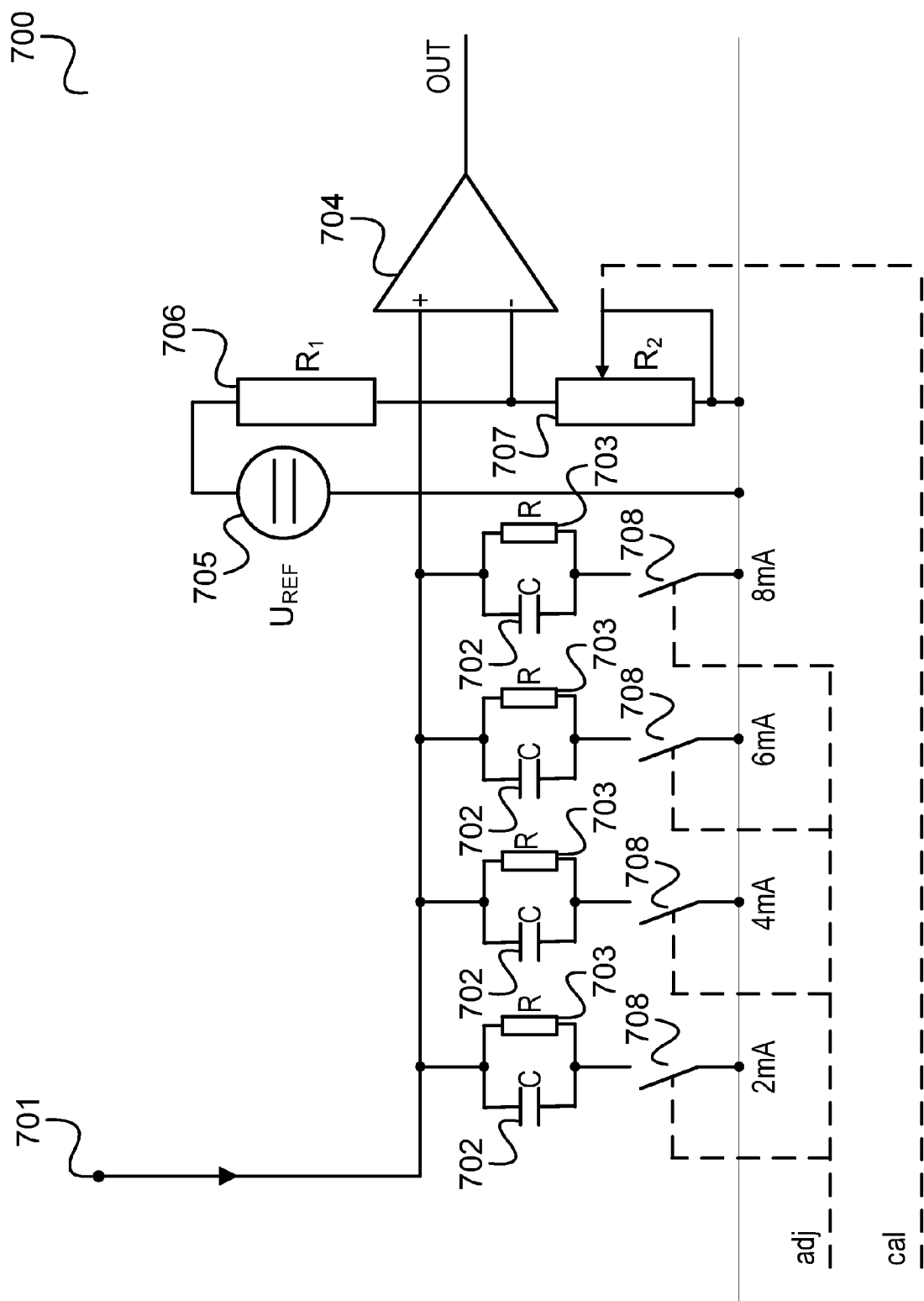
FIG. 7 shows a comparator circuit allowing calibration.

A variant of the comparator circuit 600 which allows adjusting the threshold current and calibration is shown in FIG. 7.

FIG. 7 shows a comparator circuit 700.

Analogously to the comparator circuit 600, the comparator circuit 700 includes an input node 701, a differential amplifier 704 and a voltage source 705.

The voltage source 705 is in this example connected to the negative input of the differential amplifier 704 by means of a potential divider formed by a first resistor 706 and an adjustable second resistor 707 connected serially between the voltage source 705 and the lower supply potential wherein the negative input of the differential amplifier 704 is connected to the point of connection between the first resistor 706 and the second resistor 707.

Similar to the capacitor 602 and the resistor 603, the comparator circuit 700 includes a plurality of RC combinations including a capacitor 702 and a resistor 703 connected in parallel, wherein each such RC combination may be connected between the input node 701 and the lower supply potential by means of a respective switch 708.

The threshold current may be set by setting the value of the adjustable second resistor 707. This calibration is non-linear. The calibration by means of the switches 708 (e.g. NMOS transistors) is simpler.

The calibration can be mode proportional to the adjustable resistor by choosing the first resistor 706 as the adjustable resistor.

In the following, examples for the behavior of the electronic circuit 400 generated from simulations are given with reference to FIG. 8.

Figure 8:
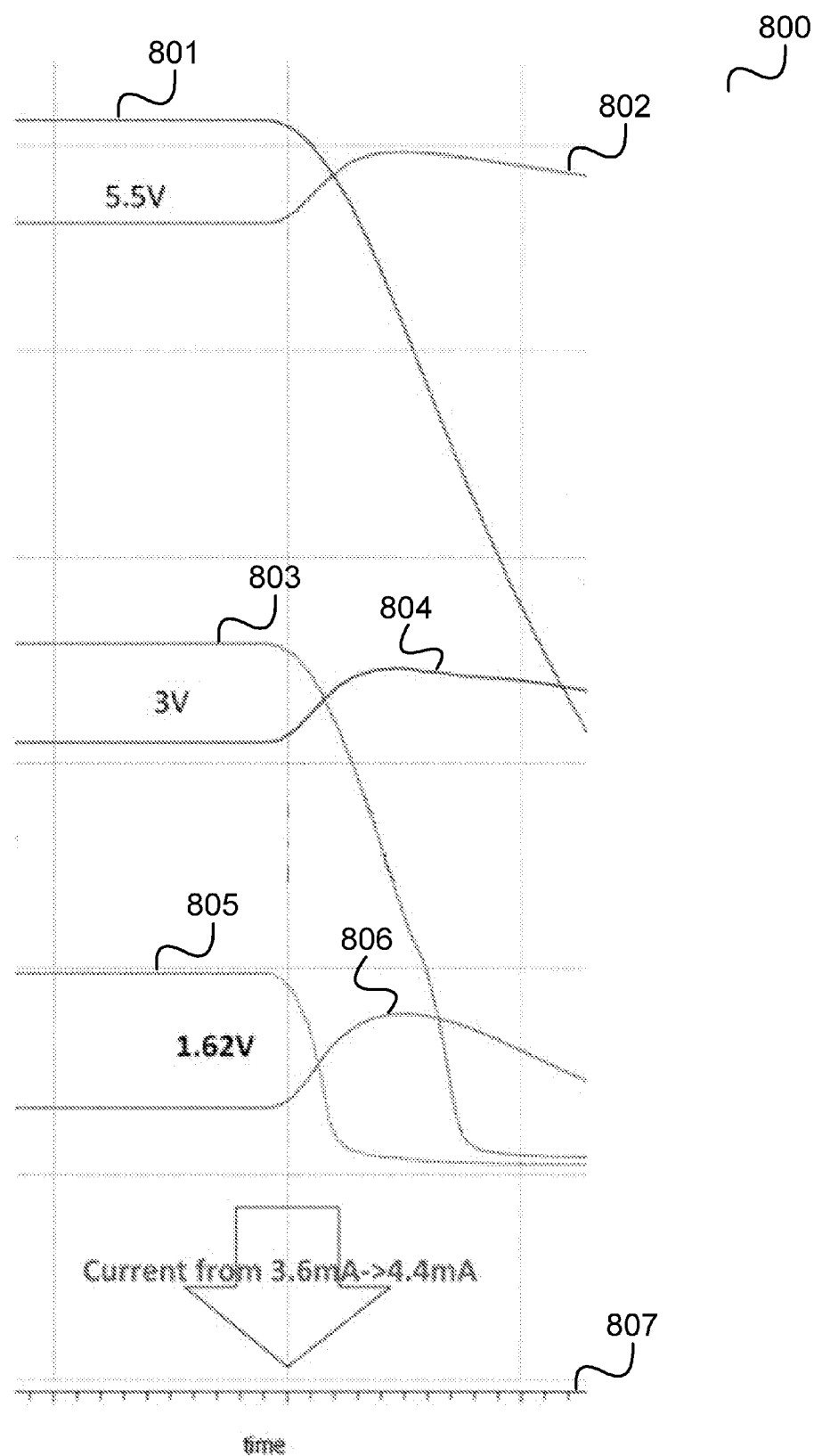
FIG. 8 shows a voltage diagram.

FIG. 8 shows a voltage diagram 800.

In FIG. 8, time increases from left to right along a time axis 807 and voltage increase from bottom to top (scaling not shown).

A first graph 801 illustrates the behavior of the voltage at node 509 u_range for a supply voltage of 5.5V.

A second graph 802 illustrates the behavior of the reference voltage u_comp for a supply voltage of 5.5V.

A third graph 803 illustrates the behavior of the voltage at node 509 u_range for a supply voltage of 3V.

A fourth graph 804 illustrates the behavior of the reference voltage u_comp for a supply voltage of 3V.

A fifth graph 805 illustrates the behavior of the voltage at node 509 u_range for a supply voltage of 1.62V.

A sixth graph 806 illustrates the behavior of the reference voltage u_comp for a supply voltage of 1.62V.

It is assumed that at 200 ns, the current through the load increases from 3.6 mA to 4.4 mA.

It can be seen that this increase of the load current causes a decrease of the voltage at node 509, i.e. of the output signal of the measurement branch. Specifically, the increase of the load current from 3.6 mA up to 4.4 mA leads to a change of the output signal of 500 mV. As described above, this output signal can be transformed by a comparator or a levelshifter to the required domain, e.g. converted to a 1 bit measurement signal.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. An electronic circuit comprising
   a load;
   a power supply node;
   a first transistor coupled between the power supply node and the load such that an input at a control terminal of the first transistor controls current flow from the power supply node to the load through the first transistor;
   a current source;
   a second transistor coupled between the current source and the load such that the input at a control terminal of the second transistor controls current flow from the current source to the load through the second transistor;
   a control node coupled to the control terminal of the first transistor and the control terminal of the second transistor; and
   an amperemeter connected to a point of coupling between the current source and the second transistor configured to measure a difference between a current provided by the current source and the current consumed by the second transistor; and
   wherein the amperemeter is a comparator configured to compare the difference with a reference current and output a signal indicating whether the difference is higher than the reference current.

2. The electronic circuit of claim 1, wherein the amperemeter is connected to the point of coupling between the current source and the second transistor such that it receives the current provided by the current source and not consumed by the second transistor.

3. The electronic circuit of claim 2, wherein the amperemeter is configured to measure the size of the received current to measure the difference between the current provided by the current source and the current consumed by the second transistor.

4. The electronic circuit of claim 1, further comprising a determiner configured to determine the current consumed by the load based on the difference between the current provided by the current source and the current consumed by the second transistor.

5. The electronic circuit of claim 4, wherein the determiner is configured to determine the current consumed by the load based on the width ratio of the first transistor and the second transistor.

6. The electronic circuit of claim 1, wherein the amperemeter is configured to output a signal indicating the difference between the current provided by the current source and the current consumed by the second transistor.

7. The electronic circuit of claim 1, wherein the first transistor has a higher width than the second transistor.

8. The electronic circuit of claim 1, wherein the first transistor and the second transistor are field-effect transistors.

9. The electronic circuit of claim 1, wherein the first transistor and the second transistor are n-channel field effect transistors.

10. The electronic circuit of claim 1, wherein the first transistor and the second transistor are NMOS transistors.

11. The electronic circuit of claim 8, wherein the control terminal of the first transistor is a gate terminal of the first transistor and the control terminal of the second transistor is a gate terminal of the second transistor.

12. The electronic circuit of claim 8, wherein the first transistor is coupled between the power supply node and the load with its source terminal and its drain terminal.

13. The electronic circuit of claim 8, wherein the second transistor is coupled between the current source and the load with its source terminal and its drain terminal.

14. The electronic circuit of claim 1, further comprising a voltage regulator configured to provide a control signal to the control node.

15. A method for measuring a load current comprising:
    controlling a current flow from a supply node to a load through a first transistor by means of a control node;
    controlling the current flow from a current source to a load through a second transistor by means of the control node; and
    measuring the difference with an amperemeter between the current provided by a current source and the current consumed by the second transistor; wherein the amperemeter is connected to the point of coupling between the current source and the second transistor; and wherein the amperemeter is a comparator configured to compare the difference with a reference current and output a signal indicating whether the difference is higher than the reference current.

16. The method of claim 15, further comprising determining the current consumed by the load based on the difference between the current provided by the current source and the current consumed by the second transistor.

17. The method of claim 15, comprising controlling current flow from the supply node to a load through a first transistor and controlling the current flow from a current source to a load through a second transistor by means of applying a control signal via the control node to a control terminal of the first transistor and a control terminal of the second transistor.

* * * * *